(12) United States Patent
Sun et al.

(10) Patent No.: US 7,900,126 B2
(45) Date of Patent: Mar. 1, 2011

(54) SYSTEMS AND METHODS FOR REDUCED COMPLEXITY LDPC DECODING

(75) Inventors: Guohui Sun, Beijing (CN); Hongwen Yang, Beijing (CN)

(73) Assignee: Via Telecom, Inc., San Diego, CA (US)

( * ) Notice: Subject to any disclaimer, the term of this patent is extended or adjusted under 35 U.S.C. 154(b) by 789 days.

(21) Appl. No.: 11/863,022

(22) Filed: Sep. 27, 2007

(65) Prior Publication Data

US 2008/0082902 A1 Apr. 3, 2008

Related U.S. Application Data

(60) Provisional application No. 60/827,353, filed on Sep. 28, 2006.

(51) Int. Cl.
*H03M 13/00* (2006.01)

(52) U.S. Cl. .................................... 714/801

(58) Field of Classification Search ........... 714/752, 714/758

See application file for complete search history.

(56) References Cited

U.S. PATENT DOCUMENTS 7,519,895 B2 * 4/2009 Kyung et al. ............... 714/780

2006/0236195 A1 * 10/2006 Novichkov et al. ......... 714/758
2007/0094568 A1 * 4/2007 Choi et al. .................. 714/758

FOREIGN PATENT DOCUMENTS

| CN | 1698272 | 11/2005 |
|---|---|---|
| CN | 1798281 | 7/2006 |

OTHER PUBLICATIONS

Papharalabos et al. Modified sum-product algorithms for decoding low-density parity-check codes. Apr. 3, 2006. Institution of engineering and Technology 2007. pp. 294-300.*

Masera et al. Finite precision implementation of LDPC decoders. May 4, 2005. IEE proceedings online No. 20050205. pp. 1098-1102.*

* cited by examiner

*Primary Examiner*—Sam Rizk
(74) *Attorney, Agent, or Firm*—Baker & McKenzie LLP

(57) ABSTRACT

Systems and methods for generating check node updates in the decoding of low-density parity-check (LDPC) codes use new approximations in order to reduce the complexity of implementing a LDPC decoder, while maintaining accuracy. The new approximations approximate the standard float-point sum-product algorithm (SPA), and can reduce the approximation error of min-sum algorithm (MSA) and have almost the same performance under 5 bits fix-point realization as the float-point sum-product algorithm (SPA).

17 Claims, 8 Drawing Sheets

SYSTEMS AND METHODS FOR REDUCED COMPLEXITY LDPC DECODING

RELATED APPLICATION INFORMATION

This application claims priority under 35 U.S.C. §119(e) to U.S. Provisional Patent Application Ser. No. 60/827,353, filed Sep. 28, 2006, entitled "Reduced-Complexity Algorithm for Decoding LDPC Codes," which is incorporated herein by reference in its entirety as if set forth in full.

BACKGROUND

1. Field of the Invention

The embodiments described herein are related to methods for Low-Density Parity-Check decoding and more particularly to methods for achieving reduced complexity Low-Density Parity-Check decoders.

2. Background of the Invention

A Low-Density Parity-Check (LDPC) code is an error correcting code that provides a method for transferring a message over a noisy transmission channel. While LDPC techniques cannot guaranty perfect transmission, the probability of lost information can be made very small. In fact, LDPC codes were the first to allow data transmission rates at close to the theoretical maximum, e.g., the Shannon Limit. LDPC techniques use a sparse parity-check matrix, e.g., a matrix populated mostly with zeros, hence the term low-density. The sparse matrix is randomly generated subject to the defined sparsity constraint.

LDPC codes can be defined as both a matrix and in graphical form. An LDPC matrix will have a certain number of rows (M) and columns (N). The matrix can also be defined by the number of 1's in each row ($w_r$) and the number of 1's in each column ($w_c$). For a matrix to be considered low-density the following conditions should be met: $w_c \ll N$ and $w_r \ll M$. An LDPC matrix can be regular or irregular. A regular LDPC matrix, is one in which $w_c$ is constant for every column and $w_r = w_c*(N/M)$ is also constant for every row. If the matrix is low-density but the number of 1's in each row or column is not constant, then such codes are called irregular LDPC code.

It will also be understood that an LDPC code can be graphically defined by its corresponding Tanner graph. Not only do such graphs provide a complete representation of the code, they also help to describe the decoding algorithm as explained in more detail below. A Tanner graph comprises nodes and edges. The nodes are separated into two distinctive sets, or types, and the edges connect the two different types of nodes. The two types of nodes in a Tanner graph are called the variable nodes (v-nodes) and check nodes (c-nodes), or parity check nodes. Thus, the Tanner graph will consist of M check nodes (the number of parity bits) and N variable nodes (the number of bits in a code word). A check node will then be connected to a variable node if there is a 1 in the corresponding element of the LDPC matrix.

The number of information bits can be represented as (K). A Generator Matrix ($G_{K \times N}$) can then be defined according to the following:

$c_{N \times 1} = G_{N \times K} d_{K \times 1}$, where $d_{K \times 1}$ = a message or data word, and $c_{N \times 1}$ = a code word.

As can be seen, the code word $c_{N \times 1}$ is generated by multiplying the message by the generator matrix. The subscripts are matrix notation and refer to the number of rows and columns respectfully. Thus, the data word and code word can be represented as single column matrices with K and N rows respectfully.

The parity check Matrix can be defined as $H_{M \times N} c_{N \times 1} = 0$.

Accordingly, FIG. 1 is a diagram illustrating a system 100 that includes a transmitter and a receiver. A portion 102 of the transmitter and a portion 110 of the receiver are shown for simplicity. Referring to FIG. 1, an encoder 104 converts a data word $d_{K \times 1}$ into a code word $c_{N \times 1}$ via application of the generator matrix $G_{K \times N}$. Modulator 106 can be configured to then modulate the code word $c_{N \times 1}$ onto a carrier so that the code word can be wirelessly transmitted across channel 108 to the receiver.

In receive portion 110, demodulator 112 can be configured to remove the carrier from the received signal; however, channel 108 will add channel effects and noise, such the signal produced by demodulator 112 can have the form: $r_{N \times 1} = 2/\sigma^2 (1 - 2 c_{N \times 1}) + w_{N \times 1}$, where r is a multilevel signal. As a result of the noise and channel effects, some of data bits d will be lost in the transmission. In order to recover as much of the data as possible, decoder 114 can be configured to use the parity check matrix $H_{M \times N}$ to produce an estimate $d'_{K \times 1}$ of the data that is very close to the original data $d_{K \times 1}$. It will be understood that decoder 114 can be a hard decision decoder or a soft decision decoder. Soft decision decoders are more accurate, but also typically require more resources.

In order to illustrate the operation of LDPC codes, the following example is presented:

$$H_{3 \times 6} = \begin{bmatrix} 1 & 0 & 1 & 0 & 1 & 0 \\ 0 & 1 & 0 & 1 & 0 & 1 \\ 1 & 1 & 0 & 0 & 0 & 1 \end{bmatrix}$$

As can be seen, the example parity check matrix H is low density, or sparse. The first row of matrix H defines the first parity check node, or equation. As can be seen, the first parity check node will check received samples $r_0$, $r_2$, and $r_4$, remembering that r is the multilevel signal produced by demodulator 112 in the receiver. The second parity check node, i.e., the second row of H, checks for received samples $r_1$, $r_3$, and $r_5$, and the third parity check node checks samples $r_0$, $r_1$, and $r_5$. In this example, there are three parity check nodes and six samples. The first and second parity check nodes are considered orthogonal, because they involve mutually exclusive sets of samples.

If it is assumed that K=3 and M=3, then the following is true:

$$H_{3 \times 6} c_{6 \times 1} = 0 \Leftrightarrow H_{3 \times 6} \begin{bmatrix} d_{3 \times 1} \\ p_{3 \times 1} \end{bmatrix} = 0 \Leftrightarrow \begin{bmatrix} 1 & 0 & 1 & 0 & 1 & 0 \\ 0 & 1 & 0 & 1 & 0 & 1 \\ 1 & 1 & 0 & 0 & 0 & 1 \end{bmatrix} \begin{bmatrix} d_0 \\ d_1 \\ d_2 \\ p_0 \\ p_1 \\ p_2 \end{bmatrix} = 0$$

This produces the following equations:

$d_0 + d_2 + p_1 = 0$ $d_1 + p_0 + p_2 = 0$ $d_0 + d_1 + p_2 = 0$

These equations reduce to:

$$p_0 = d_0$$

$$p_1 = d_0 + d_2$$

$$p_2 = d_0 + d_1$$

Thus, for example, if d=[0;1;0], then p=[0;0;1] and c=[0; 1;0;0;0;1].

FIG. 2 is a Tanner Graph illustrating the operation of H in the example above. As can be seen, the graph of FIG. 2 has three parity check nodes 202, 204, and 206, and 6 variable nodes 208, 210, 212, 214, 216, and 218, which correspond to the bits of c. Parity check nodes 202, 204, and 206 are connected with variable nodes 208, 210, 212, 214, 216, and 218, via edges 220, 222, 224, 226, 228, 230, 232, 234, and 236 as dictated by the entries in H. In other words, each edge 220, 222, 224, 226, 228, 230, 232, 234, and 236 should correspond to a 1 in H.

In an LDPC decoder, the operations of the parity check and variable nodes can be implemented by processors. In other words, each parity check node can be implemented by a parity check processor, and each variable check node can be implemented by a variable node processor. An LDPC decoder is then an iterative decoder that implements a message passing algorithm defined by H.

Unfortunately, conventional LDPC decoding techniques result in a high complexity, fully parallel decoder implementations where all the messages to and from all the check node processors have to be computed at every iteration in the decoding process. This leads to large complexity, increased resource requirements, and increased cost.

Hence, there are many current efforts devoted to reducing the complexity of check node message updating, while keeping the performance loss as small as possible. The most common simplification is the min-sum algorithm (MSA), which has greatly reduced the complexity of check node updates, but incurs a 0.3-0.4 dB degradation in performance relative to standard sum-product algorithm (SPA) check node implementations. To combat this performance degradation, modifications of the MSA using a normalization term and an offset adjustment term have also been proposed. Such solutions do have reduced performance loss compared with the more conventional MSA implementations, but there is still significant performance loss. In addition, two-dimensional MSA schemes have been proposed that can further improve the performance of MSA with some additional complexity. Thus, in conventional implementations, there is a constant trade-off between complexity and performance.

SUMMARY

Systems and methods for generating check node updates in the decoding of low-density parity-check (LDPC) codes are described below. The systems and methods described below use new approximations in order to reduce the complexity of implementing a LDPC decoder, while maintaining accuracy. The new approximations approximate the standard sum-product algorithm (SPA), and can reduce the approximation error of min-sum algorithm (MSA) and has almost the same performance as sum-product algorithm (SPA) under both floating precision operation and fixed-point operation.

In one aspect, a receiver can include a demodulator configured to receive a wireless signal, remove a carrier signal from the wireless signal and produce a received signal, and a Low Density Parity Check (LDPC) processor configured to recover an original data signal from the received signal. The LDPC processor can include a plurality of variable node processors configured to receive the received signal and generate variable messages based on the received signal, and a parity node processor configured to receive the variable messages and generate soft outputs based in the variable messages In another aspect, a receiver comprises a demodulator configured to receive a wireless signal comprising an original data signal and a carrier signal, remove the carrier signal from the wireless signal, and produce a received signal, and a Low Density Parity Check (LDPC) processor coupled with the demodulator, the LDPC processor configured to recover the original data signal from the received signal. The LDPC processor comprises a plurality of variable node processors configured to generate variable messages based on the received signal, and a check node processor coupled with the plurality of variable node processors, the check node processor configured to implement an approximation of a sum product algorithm (SPA) using base 2 logarithm operations.

In still another aspect, the check node processor is configured to implement an approximation of a sum product algorithm (SPA) using base 2 logarithms and rounding all operand and results to the nearest integer.

In still another aspect, the check node processor comprises binary hardware circuits.

In still another aspect, the integers produced are limited to within $\pm A_{max} = \pm(2^{v-1}-1)$.

In still another aspect, the check node processor comprises v fixed point circuits including 1 bit for the signs of the integers and v−1 bits for the absolute value.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION

In the descriptions that follow, certain example parameters, values, etc., are used; however, it will be understood that the embodiments described herein are not necessarily limited by these examples. Accordingly, these examples should not be seen as limiting the embodiments in any way. Further, the embodiments of an LDPC decoder described herein can be applied to many different types of systems implementing a variety of protocols and communication techniques, such as Bi-Phase Shift Keying (BPSK) modulation techniques, Quadrature Phase Shift Keying (QPSK) modulation techniques, or Quadrature Amplitude Modulation (QAM) techniques. Accordingly, the embodiments should not be seen as limited to a specific type of system, architecture, protocol, air interface, etc. unless specified.

Figure 1:
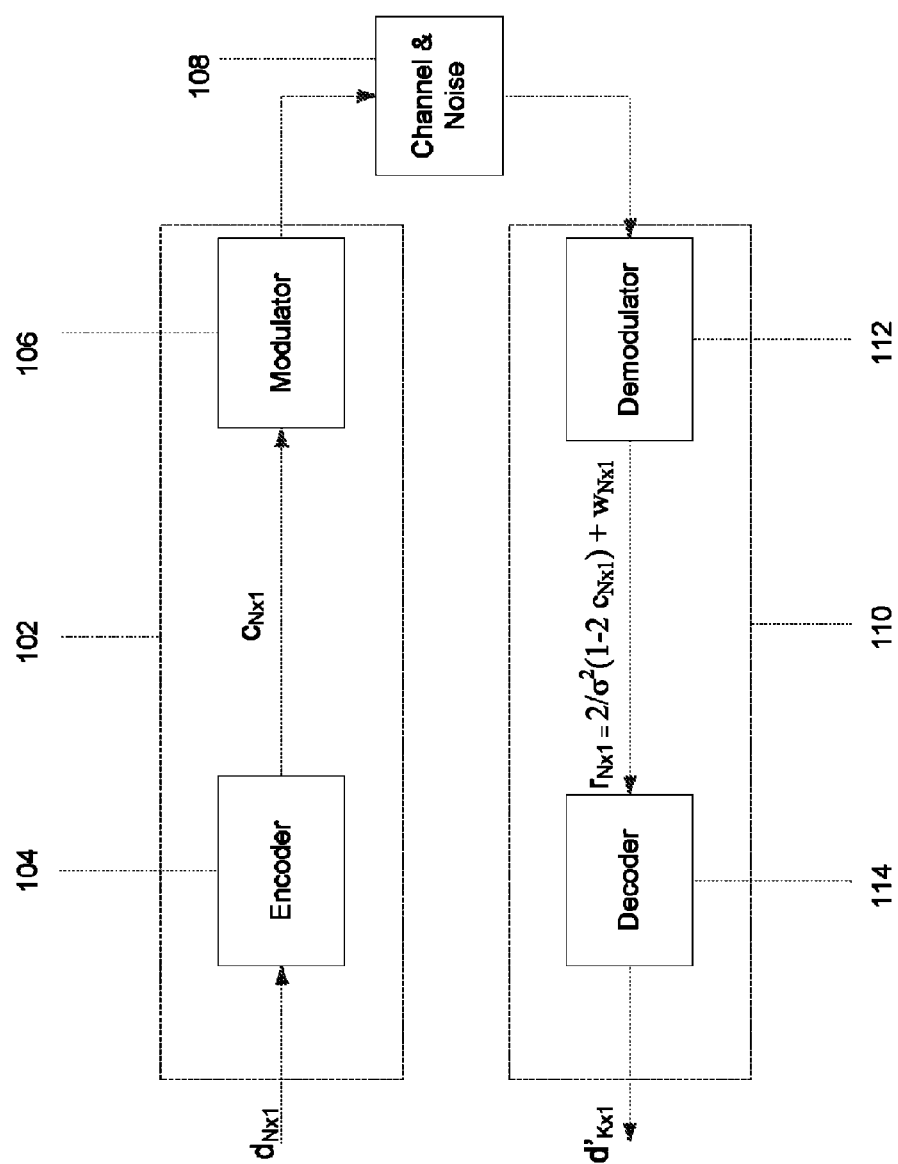
FIG. 1 is a diagram illustrating an example communication system that uses LDPC codes.
Figure 2:
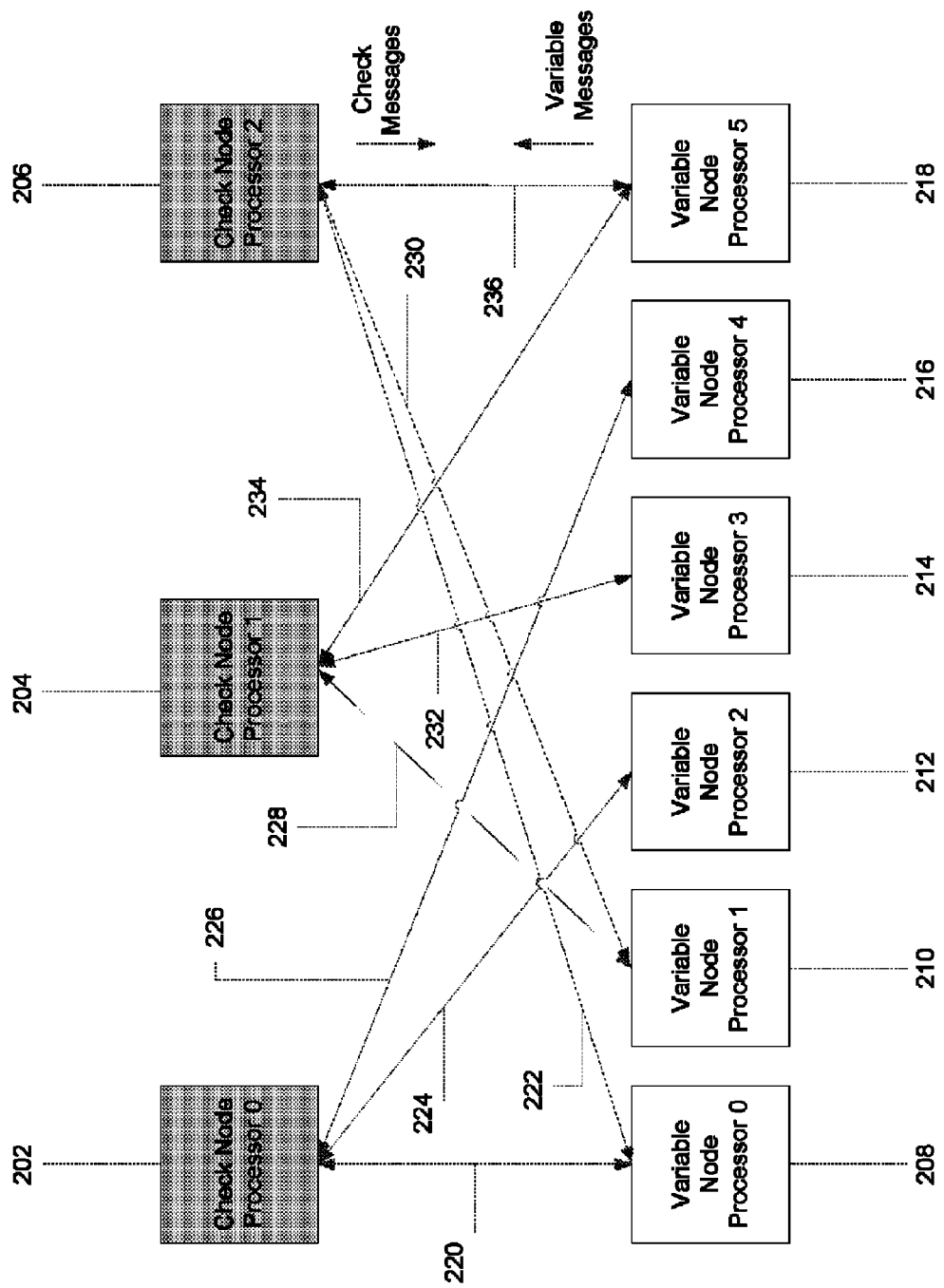
FIG. 2 is a diagram illustrating the operation of an exemplary parity check matrix.
Figure 3:
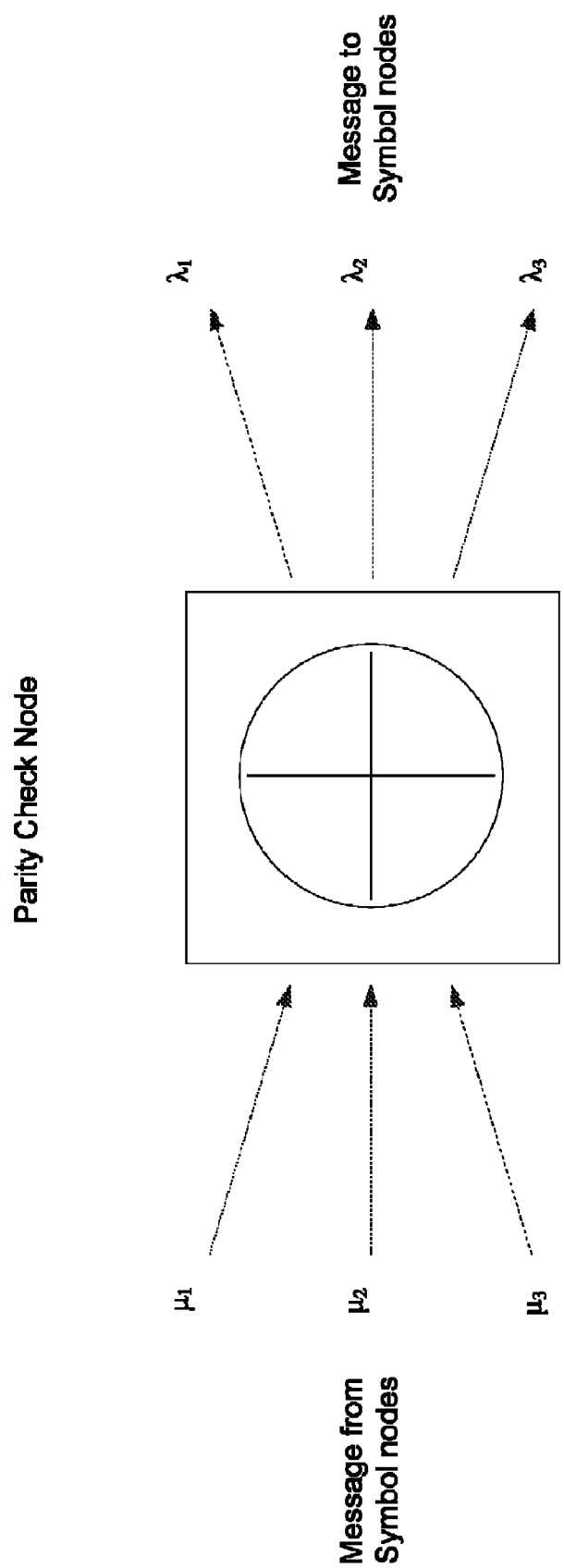
FIG. 3 is a diagram illustrating an exemplary parity node processor.

A check node processor 302 of degree n is shown in FIG. 3. At each iteration, the outgoing soft messages $\{\lambda_i, i=1, 2, \ldots n\}$ are updated with the incoming soft messages $\{u_i, i=1,2, \ldots n\}$. The outgoing soft message is defined as the logarithm of the ratio of probability that the corresponding bit is 0 or 1.

With the standard sum-product algorithm, the outgoing message is determined as follows:

$$\lambda_i = 2\tanh^{-1} \prod_{\substack{j=1 \\ j \neq i}}^{n} \tanh\frac{u_j}{2}, i = 1, 2 \ldots n. \tag{1}$$

The outgoing soft messages are then fed back to the variable node processors for use in generating outputs $u_i$ during the next iteration; however, a soft message $\lambda_i$ based on a variable node output from a particular node are not returned to that node. Thus, the $j \neq i$ constraint in the following term of (1):

$$\prod_{\substack{j=1 \\ j \neq i}}^{n} \tanh\frac{u_j}{2}, i = 1, 2 \ldots n.$$

Figure 4:
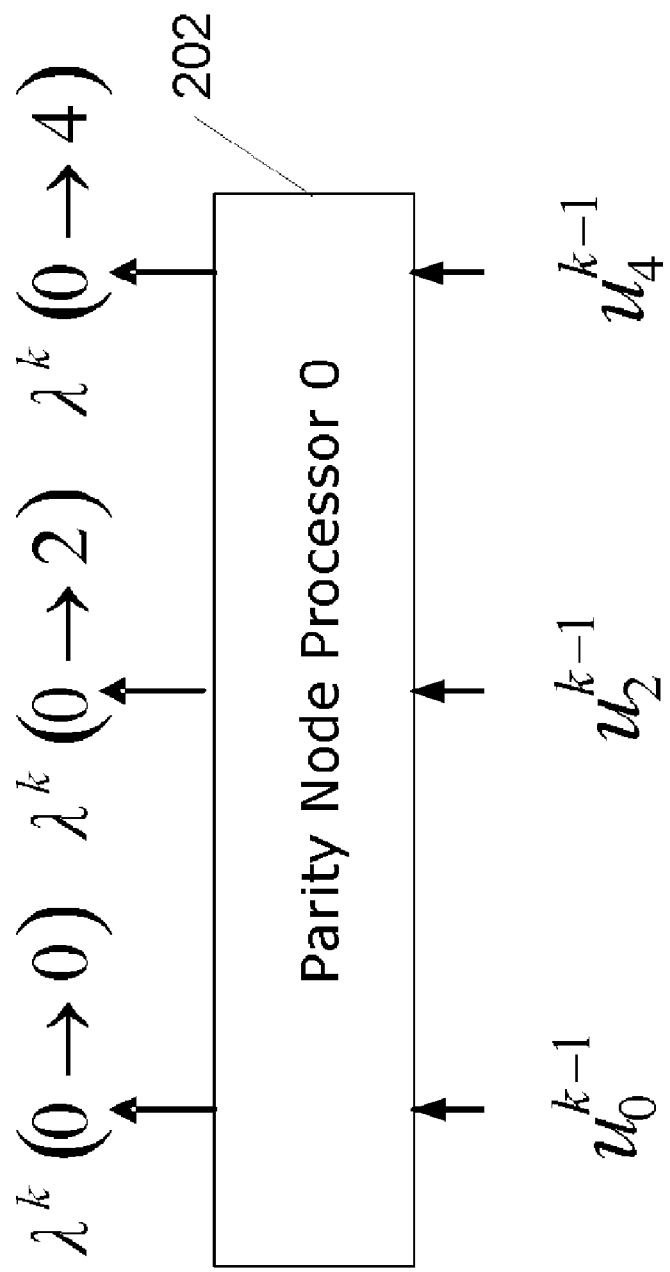
FIG. 4 is a diagram illustrating the operation of an exemplary parity node processor.

This can also be illustrated with the aide of FIG. 4, which is a diagram illustrating the operation of parity node processor 202. First, the LDPC decoder will initialize the variable data bits $u_0, u_1, u_2 \ldots u_6$ of variable node processors 208, 210, 212, 214, 216, and 218 with $r_0, r_1, r_2, \ldots r_6$. Referring to FIG. 4, $u_0^{k-1}$, $u_2^{k-1}$, and $u_4^{k-1}$ are the variable messages sent from variable nodes 208, 212, and 216 to parity node processor 202. Parity node processor 202 operates on these messages and computes its messages $\lambda^k$. For example, $\lambda^k(0 \to 2)$ represents the message sent from parity node 202 to variable node 212 at the kth iteration.

The messages produced by parity node processor 202 can be defined using the following equations:

$$\lambda^k(0 \to 0) = 2\tanh^{-1}\left[\tanh\left(\frac{u_2^{k-1}}{2}\right)\tanh\left(\frac{u_4^{k-1}}{2}\right)\right] \tag{2}$$

$$\lambda^k(0 \to 2) = 2\tanh^{-1}\left[\tanh\left(\frac{u_0^{k-1}}{2}\right)\tanh\left(\frac{u_4^{k-1}}{2}\right)\right].$$

$$\lambda^k(0 \to 4) = 2\tanh^{-1}\left[\tanh\left(\frac{u_0^{k-1}}{2}\right)\tanh\left(\frac{u_2^{k-1}}{2}\right)\right]$$

Thus parity node processor 202 can be configured to implement the above equations (2). The soft messages produced by the parity nodes, e.g., parity node 202, are then fed back to variable nodes 208, 210, 212, 214, 216, and 218, for use in the next iteration.

Figure 5:
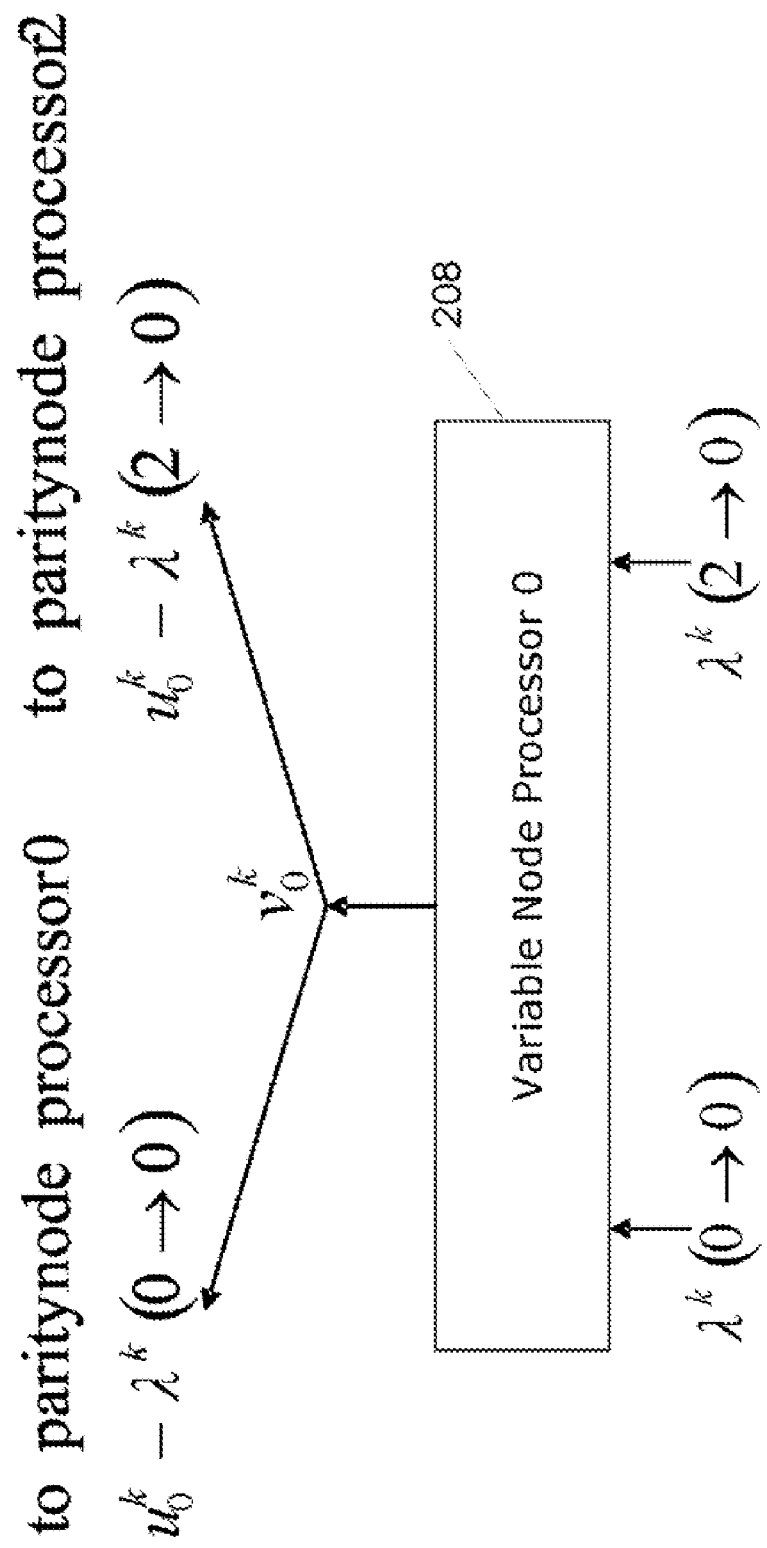
FIG. 5 is a diagram illustrating the operation of an exemplary variable node processor.

For example, FIG. 5 is a diagram illustrating the operation of variable node processor 208. Referring to FIG. 5, variable node processor 208 receives as inputs messages from parity node processors 202 and 206 and produces variable messages to be sent back to the same parity node processors 202 and 206. In the example of FIG. 4 and FIG. 5, hard decisions are taken on the multilevel variable $u_n^k$ and checked to see if they meet the parity node equations defined above. If there is a match, or if a certain defined number of iterations is surpassed, then the decoder can be stopped.

Variable node processor 208 can be configured to implement the following equation:

$$u_0^k = u_{ch,0} + \lambda^k(0 \to 0) + \lambda^k(2 \to 0), \tag{3}$$

where $u_{ch,0}$ is the message from the channel, which does not change with each iteration It will be understood that the decoder described above can be implemented using hardware and/or software configured appropriately and that while separate parity check processors and variable node processors are described, these processors can be implemented by a single processor, such as a digital signal processor, or circuit, such as an Application Specific Integrated Circuit (ASIC); however, as mentioned above, implementation of a LDPC processor such as that described with respect to FIGS. 2-5 can result in large complexity, stringent memory requirements, and interconnect complexity that can lead to bottlenecks. These issues can be exacerbated if multiple data rates are to be implemented. In other words, practical implementation if such a decoder can be limited.

Accordingly, using the systems and method described above, the resources, i.e., complexity, required to implement a parity node can be reduced, while still maintaining a high degree of precision. In certain embodiments, the complexity can be reduced even further through degree reduction techniques. In other words, the number of inputs to the parity node can be reduced, which can reduce the resources required to implement the parity node. It should also be noted that in many parity node implementations, the sign and the absolute value of the outgoing soft message are calculated separately.

Thus, a LDPC code with parity check matrix H of size M×N has M check nodes and N variable nodes. In the decoder, soft messages are propagated and updated iteratively between variable nodes and check nodes until they agree at a valid codeword. Otherwise, the decoding will terminated with failure. The updating algorithm at a variable node involves two kinds of input messages, the message from channel observation and the message from check nodes.

The soft message is defined as the logarithm ratio of probability:

From channel observation:

$$L(m) = \ln\frac{p^0(m)}{1 - p^0(m)}, m \in [1, \ldots, N], \text{ and} \tag{4}$$

From check nodes:

$$\lambda_i(m) = \ln\frac{p_i^c(m)}{1 - p_i^c(m)}, m \in [1, \ldots, N], i \in C(m), \tag{5}$$

where m refers to the m-th variable node, i.e. the m-th bit in the codeword.

L(m) is the soft message from channel observation, $p^o(m)$ is the a posteriori probability that the bit is 0 conditioned on the channel observation y(m).

C(m) in (5) is the set of check nodes connected to the m-th variable node. $p_c^i(m)$ is the probability estimated by check node i in C(m) that the m-th bit is 0.

For BPSK modulation and AWGN channel with unit gain and noise variance $\sigma^2$, L(m) becomes:

$$L(m) = \frac{2y(m)}{\sigma^2}. \quad (6)$$

The variable node send message $u_i(m)$ to check node i. $u_i(m)$ is defined in the same way as in (4):

$$u_i(m) = \ln\frac{p_i^v(m)}{1-p_i^v(m)}, m \in [1, \ldots, N], i \in C(m). \quad (7)$$

Where $p_i^v(m)$ is the probability estimated by variable node that the m-th bit is 0.

The updating algorithm at a variable nodes can be described as:

$$u_i(m) = \sum_{j \in C(m)\setminus i} \lambda_j(m). \quad (8)$$

Where $C(m)\setminus i$ denotes the subset of $C(m)$ with i excluded.

The outgoing message from a check node to a variable node is a function of all incoming messages from all variable nodes connected to this check node except the one that the message will be send to, i.e.:

$$\lambda_j(m) = f(u_j(k), k \in V(j)\setminus m), j \in [1, \ldots, M], m \in V(j). \quad (9)$$

where V(j) is the set of the variable nodes connected to the j-th check node.

The standard updating algorithm for $f$ in (9) is the sum-product algorithm (SPA) described above and presented again here:

$$\lambda_j(m) = 2\tanh^{-1}\prod_{k \in V(j)\setminus m} \tanh\frac{u_j(k)}{2} \quad (10)$$

This is equivalent to:

$$\lambda_j(m) = \bigoplus_{k \in V(j)\setminus m} u_j(k). \quad (11)$$

The right hand of (11) stands for $|V(j)|-1$ successive $\oplus$ operations, which is a binary operator defined as:

$$x \oplus y \triangleq \ln\frac{1+e^{x-y}}{e^x+e^y}, \quad (12)$$

for x, y real numbers. It can be shown that the $\oplus$ operator is commutative and associative.

The variable node updating algorithm (8) only involves summations. Thus most of the decoding complexity comes from the check nodes which need large amount of the evaluation of logarithms and exponentials. A simplified version for SPA is min-sum algorithm (MSA) which uses a simple approximation to evaluate the $\oplus$ operation:

$$x \oplus y \approx sgn(x)sgn(y)\min\{|x|,|y|\}. \quad (13)$$

Though MSA is simple enough to be efficiently implemented with hardware, it has some performance loss compared with SPA. The amount of loss depends on the specific code structure and code rate, generally on the order of 0.3~0.4 dB. Many more improvements have been published in the literature with better performance, even lossless compared with SPA.

Certain embodiments described herein modify SPA by replacing the base e logarithm ln in equations (3),(4) and (7) with base 2 logarithm $\log_2$, then (6) will become:

$$L(m) = \frac{2y(m)}{\sigma^2\ln(2)}. \quad (14)$$

and (12) becomes:

$$x \oplus y = \log_2\frac{1+2^{x+y}}{2^x+2^y}. \quad (15)$$

All operands and results involved in the decoding algorithm described herein can be rounded to the nearest integers. Equations (14) and (15) then become:

$$L(m) \approx \text{Round}\left(\frac{2y(m)}{\sigma^2\log(2)}\right), \text{and} \quad (16)$$

(16)

$$x \oplus y) \approx \text{Round}\left(\log_2\frac{1+2^{x+y}}{2^x+2^y}\right) \quad (17)$$

Where Round( ) denotes rounding the operand to the nearest integer.

The right hand of (16) and (17) are approximations due to the round off error, which is smaller than 0.5.

Note that with (16), (8) and (17), the whole decoding algorithm only use integer operations. In particular, the integer power of 2 and the integer logarithm in (17) can be easily implemented with binary hardware circuits. Thus, the complexity of standard SPA implementations can be greatly reduced. Simulation results are produced below to show that the performance loss is within 0.1 dB.

Further, it can be shown that (17) is exactly equivalent to the following:

$$x \oplus y \approx \text{sign}(x)\text{sign}(y)[\min(|x|,|y|) - \varepsilon(|x|,|y|)], \quad (18)$$

$$\varepsilon(a,b) = \begin{cases} 1 & |a-b| \leq 1 \text{ and } \min(a,b) > 1 \\ 0 & \text{else}. \end{cases} \quad (19)$$

Compare (18) and (19) with the MSA in (13), and it can be seen that the complexity is only slightly increased. It should be noted that in hardware implementations, decreasing by 1 is less complex than normal subtraction and testing of $\leq 1$ and $>1$ only requires some bit testing logic.

If all the integers involved in the algorithm are limited to within $\pm A_{max} = \pm(2^{v-1}-1)$, then the algorithm can be directly implemented with v bits fix point circuits where 1 bit for signs and v−1 bits for the absolute value. Except that (19) should be modified to:

$$\varepsilon(a,b) = \begin{cases} 1 & |a-b| \leq 1 \text{ and } \min(a,b) > 1 \text{ and } \max(a,b) < A_{max} \\ 0 & \text{else}. \end{cases} \quad (20)$$

This is because when one input is $A_{max}$, the real value may range in $[A_{max}, +\infty]$, thus the real value for $|a-b|$ is highly likely to be greater than one.

Accordingly, using the systems and method described above, the resources, i.e., complexity, required to implement a check node can be reduced, while still maintaining a high degree of precision. In certain embodiments, the complexity can be reduced even further through degree reduction techniques. In other words, the number of inputs to the check node can be reduced, which can reduce the resources required to implement the check node. It should also be noted that in many check node implementations, the sign and the absolute value of the outgoing soft message are calculated separately.

Figure 6:
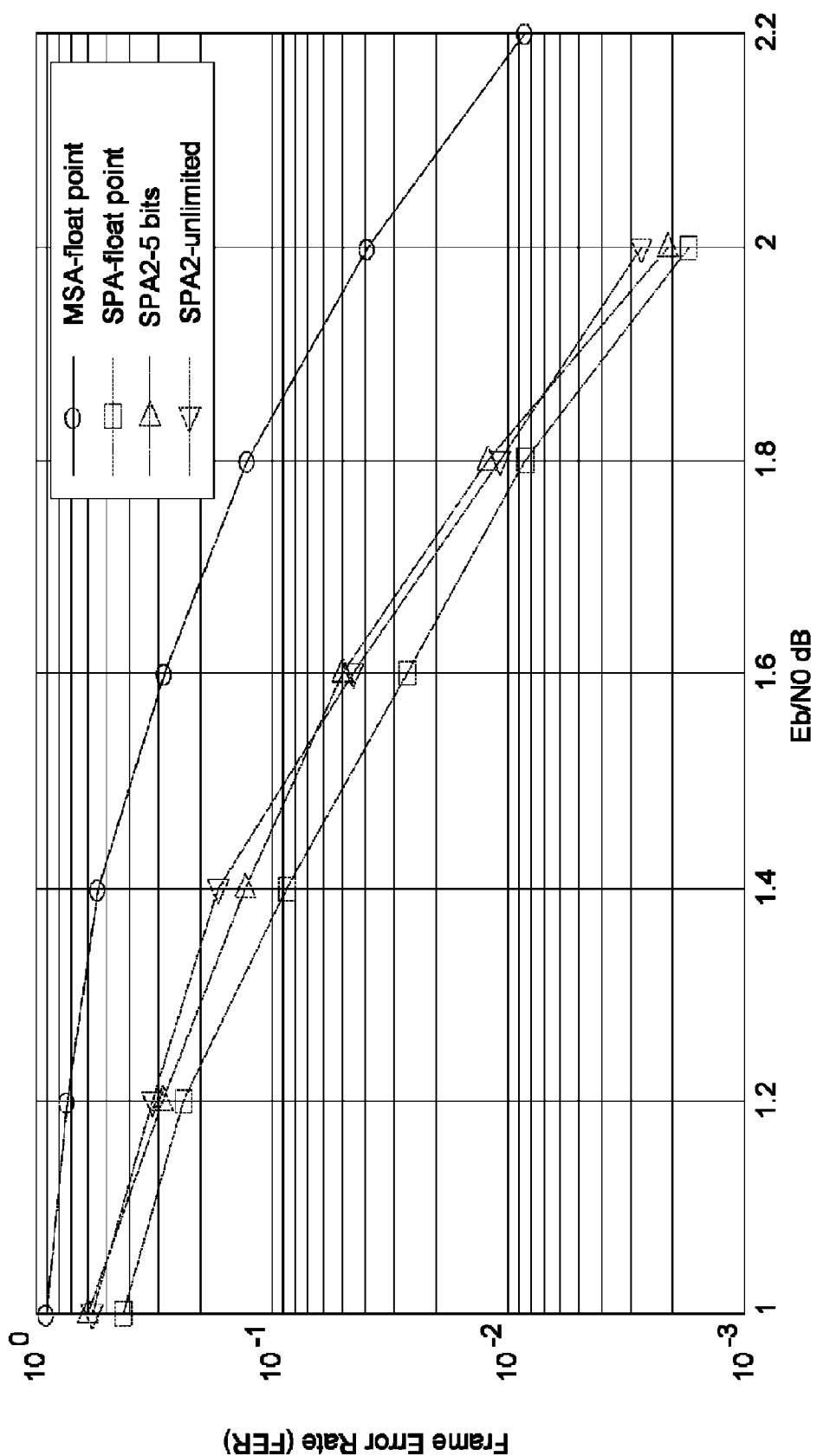
FIG. 6 is a graph illustrating the simulated frame error rate (FER) performance under AWGN channel for float-point SPA float-point MSA and our proposed method with different quantization bits.
Figure 7:
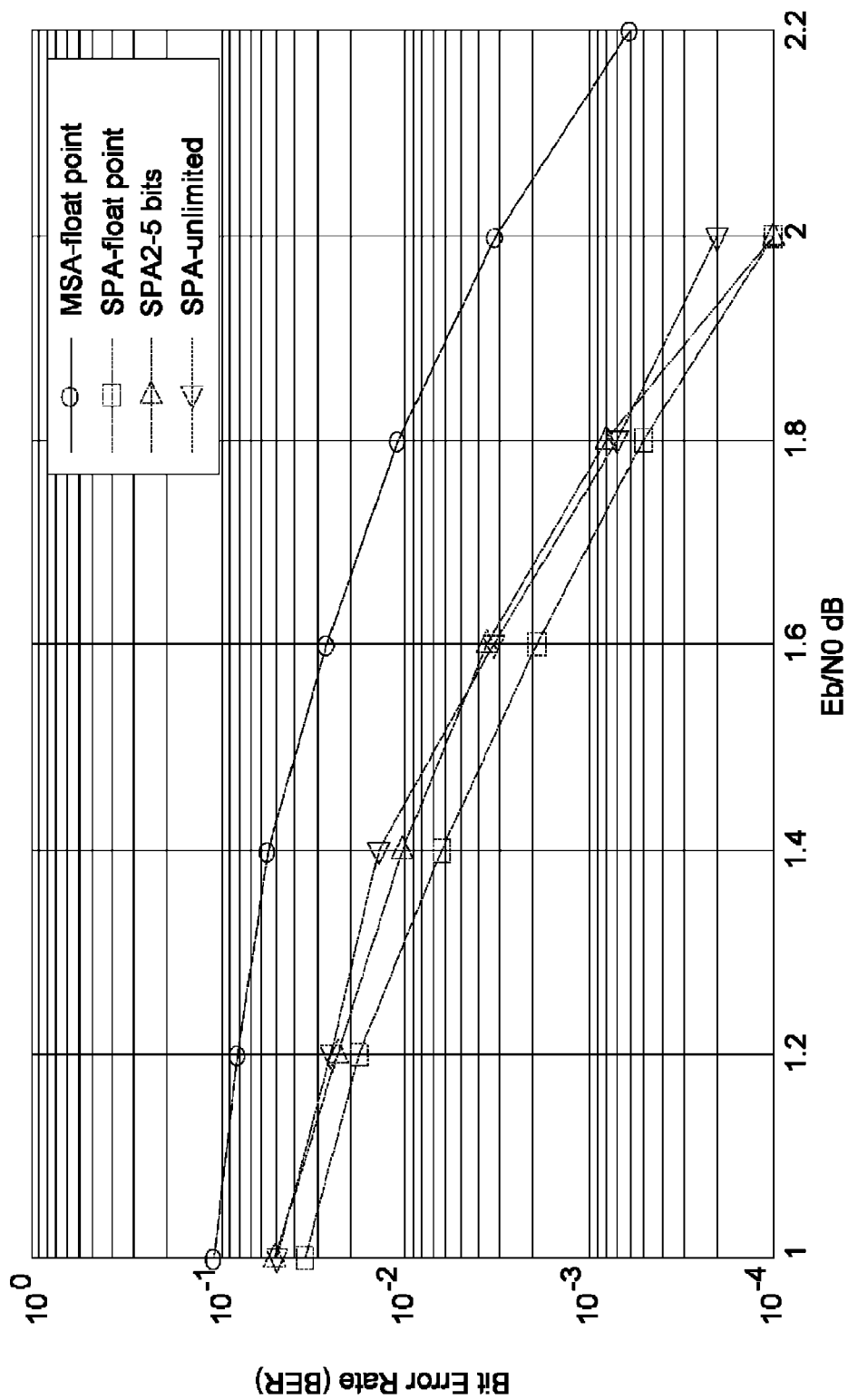
FIG. 7 is a graph illustrating the simulated frame error rate (FER) performance under AWGN channel for float-point SPA float-point MSA and our proposed method with different quantization bits.

FIG. 6 and FIG. 7 are graphs illustrating respectively the simulated frame error rate (FER) and bit error rate (BER) performance under AWGN channel for float-point SPA, float-point MSA and the method described herein with different quantization bits. The LDPC code is the irregular (1152, 576) ½-rate LDPC codes constructed according to 802.16eD12. The decoder use layered decoding with maximum iteration number as 30. The curves labeled as 'SPA2' refers to the proposed algorithm where all the operations are integer operation. The curve labeled as 'SPA2 unlimited' refers to the case where $A_{max}=\infty$. In computer simulation, this is in fact limited by the largest integer of the system. This curve reflects the impacts of round error in (17) and (18). It can be shown that the performance loss caused by round off error is less than 0.1 dB and limiting the integer to 5 bits ($A_{max}=15$) will cause almost no further loss.

It should be noted that we are comparing with the float-point SPA and float-point MSA are being compared. These two algorithms require about 8 bits to keep the same performance if they are directly implemented with fixed-point circuits.

Figure 8:
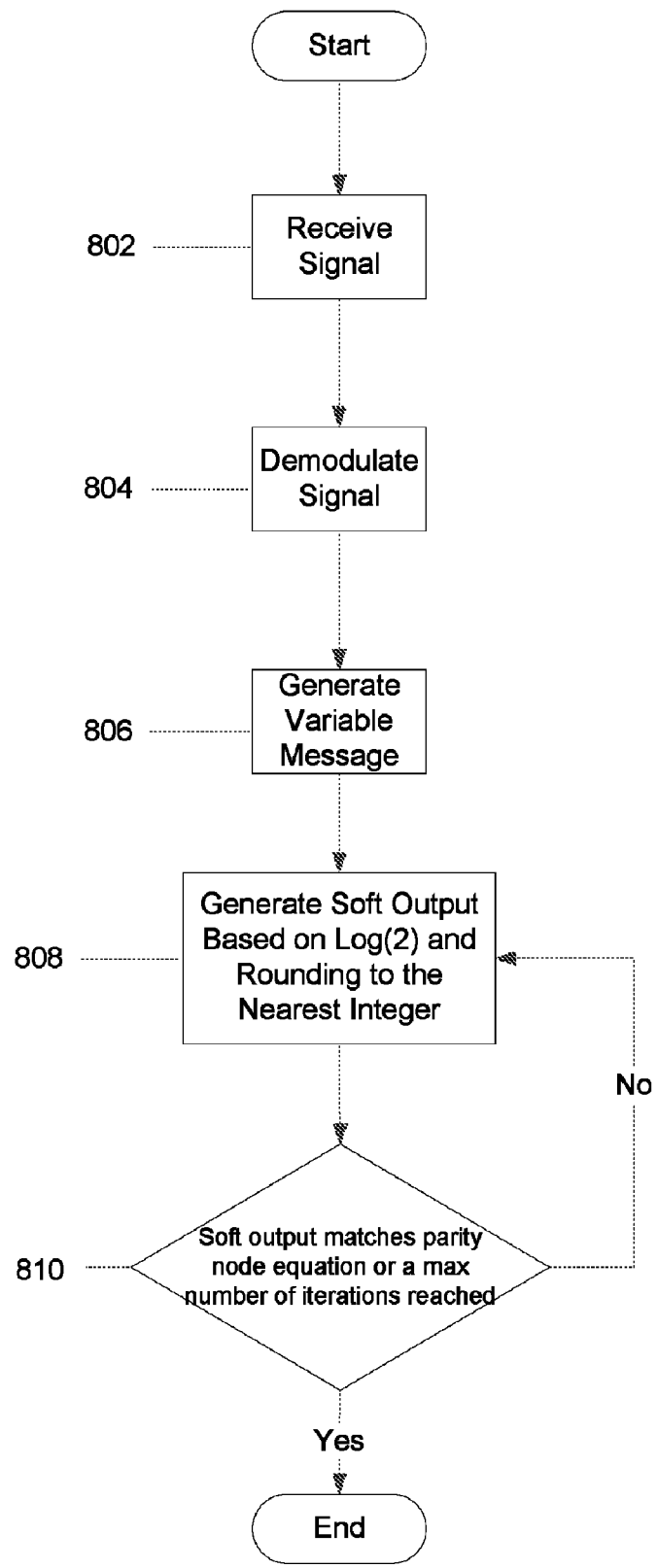
FIG. 8 is a flow chart illustrating an example method of for performing a modified LDPC decoding.

FIG. 8 is a flow chart illustrating an example method for performing LDPC decoding as described above. First, in step 802, a signal can be received. In step 804, the signal can be demodulated. In step 806, the variable messages can be generated from the demodulated signal as an estimate of the data bits. In step 808, an operation can be performed on the variable messages to approximate the value of the original signal. This approximation is based a sum product algorithm (SPA) using base 2 logarithm operations and rounding the resulting values, as described above. This approximation can be performed in accordance with equations 16 and 17. In step 810, the result of step 808 can be evaluated to determine if the variable message matches the parity node equations. If there is a match or if a certain number of iterations is surpassed then the LDPC decoder can stop.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed is:

1. A receiver, comprising:
a demodulator configured to receive a wireless signal comprising an original data signal and a carrier signal, remove the carrier signal from the wireless signal, and produce a received signal; and
a Low Density Parity Check (LDPC) processor coupled with the demodulator, the LDPC processor configured to recover the original data signal from the received signal, the LDPC processor comprising:
a plurality of variable node processors configured to generate variable messages based on the received signal, and
a check node processor coupled with the plurality of variable node processors, the check node processor configured to implement an approximation of a sum product algorithm (SPA) using base 2 logarithm operations and rounding all operands and results to the nearest integer.

2. The receiver of claim 1, wherein the check node processor is further configured to implement an approximation of a sum product algorithm (SPA) which is equivalent to:

$$x \oplus y \approx \text{sign}(x)\,\text{sign}(y)[\min(|x|,|y|) - \varepsilon(|x|,|y|)]$$

where $$\varepsilon(a,b) = \begin{cases} 1 & |a-b| \leq 1 \text{ and } \min(a,b) > 1 \\ 0 & \text{else}. \end{cases}$$

3. The receiver of claim 1, wherein the check node processor comprises binary hardware circuits.

4. The receiver of claim 1, wherein the integers produced are limited to within $\pm A_{max} = \pm(2^{v-1}-1)$.

5. The receiver of claim 4, wherein the check node processor comprises v fixed point circuits including 1 bit for the signs of the integers and v−1 bits for the absolute value.

6. The receiver of claim 1, wherein the LDPC processor is implemented in a single processor.

7. The receiver of claim 1, wherein the received signal is modulated using any combination of the following techniques:
Bi-Phase Shift Keying (PBSK);
Quadrature Phase Shift Keying (QPSK); and
Quadrature Amplitude Modulation (QAM).

8. A Low Density Parity Check (LDPC) processor, comprising:
a plurality of variable node processors configured to generate variable messages based on the received signal, and
a check node processor coupled with the plurality of variable node processors, the check node processor configured to implement an approximation of a sum product algorithm (SPA) using base 2 logarithm operations and rounding all operands and results to the nearest integer.

9. The LDPC processor of claim 8, wherein the check node processor is further configured to implement an approximation of a sum product algorithm (SPA) which is equivalent to $$x \oplus y \approx \text{sign}(x)\,\text{sign}(y)[\min(|x|,|y|) - \varepsilon(|x|,|y|)]$$

where $$\varepsilon(a,b) = \begin{cases} 1 & |a-b| \leq 1 \text{ and } \min(a,b) > 1 \\ 0 & \text{else}. \end{cases}$$

10. The LDPC processor of claim 9, wherein the integers produced are limited to within $\pm A_{max} = \pm(2^{v-1}-1)$.

11. The receiver of claim 10, wherein the check node processor comprises v fixed point circuits including 1 bit for the signs of the integers and v−1 bits for the absolute value.

12. The LDPC processor of claim 8, wherein the check node processor comprises binary hardware circuits.

13. A method for processing a received signal using a parity node processor included in a LDPC decoder, the method comprising:
   receiving a signal;
   demodulating the signal;
   generating a variable message; and
   generating a soft output based on the variable message using an approximation of a sum product algorithm (SPA) using base 2 logarithm operations and rounding all operands and results to the nearest integer.

14. The method of claim 13, further comprising refining the soft output variable message iteratively until either the soft output variable message matches a parity node equation or a maximum number of iterations has occurred.

15. The method of claim 13, wherein the soft output generated is equivalent to:

$$x \oplus y \approx \text{sign}(x)\,\text{sign}(y)[\min(|x|, |y|) - \varepsilon(|x|, |y|)]$$

where $$\varepsilon(a, b) = \begin{cases} 1 & |a - b| \leq 1 \text{ and } \min(a, b) > 1 \\ 0 & \text{else.} \end{cases}$$

16. The method of claim 13, wherein the integers produced are limited to within $\pm A_{max} = \pm(2^{v-1}-1)$.

17. The method of claim 13, wherein the signal is modulated using any combination of the following techniques:
   Bi-Phase Shift Keying (PBSK);
   Quadrature Phase Shift Keying (QPSK); and
   Quadrature Amplitude Modulation (QAM).

\* \* \* \* \*